United States Patent
Hamajima et al.

(10) Patent No.: US 7,012,938 B2
(45) Date of Patent: Mar. 14, 2006

(54) LASER DEVICE, CONTROLLER AND METHOD FOR CONTROLLING THE LASER DEVICE

(75) Inventors: Yasuhiro Hamajima, Yamanashi (JP); Hiroyuki Imoto, Yamanashi (JP); Hiroaki Maki, Yamanashi (JP)

(73) Assignee: Fujitsu Quantum Devices Ltd., Yamanashi (JP)

( * ) Notice: Subject to any disclaimer, the term of this patent is extended or adjusted under 35 U.S.C. 154(b) by 236 days.

(21) Appl. No.: 10/464,741

(22) Filed: Jun. 19, 2003

(65) Prior Publication Data

US 2004/0052281 A1    Mar. 18, 2004

(30) Foreign Application Priority Data

Jun. 21, 2002    (JP) .............................. 2002-182090

(51) Int. Cl.
*H04B 10/04*    (2006.01)

(52) U.S. Cl. ...................................... 372/26; 372/38.07

(58) Field of Classification Search .................... 372/26
See application file for complete search history.

(56) References Cited

U.S. PATENT DOCUMENTS 4,924,470 A * 5/1990 Ries ............................ 372/26
5,394,416 A * 2/1995 Ries ............................ 372/26

FOREIGN PATENT DOCUMENTS

| JP | 3-278586 | 12/1991 |
| JP | 7-226714 | 8/1995 |
| JP | 8-254672 | 10/1996 |

* cited by examiner

*Primary Examiner*—James Vannucci
(74) *Attorney, Agent, or Firm*—Westermen, Hattori, Daniels & Adrian, LLP

(57) ABSTRACT

A laser device includes a laser diode, and a controller that superimposes a low-frequency signal on a modulating signal applied to the laser diode. The low-frequency signal has an amplitude that correlates with an amplitude of the modulating signal.

8 Claims, 12 Drawing Sheets

LASER DEVICE, CONTROLLER AND METHOD FOR CONTROLLING THE LASER DEVICE

BACKGROUND OF THE INVENTION

1. Field of the Invention

The present invention generally relates to a laser device, and a controller and method for controlling the laser device. More particularly, the present invention relates to a laser device supplied with a modulating signal on which a low-frequency component is superimposed, and a controller and method for controlling such a laser device.

2. Description of the Related Art

In a laser device equipped with no cooling means, a variation in the performance caused by temperature change is handled as a variation in quantum efficiency ($\Delta P/\Delta I$: P denotes optical power and I denotes drive current), particularly, differential quantum efficiency $\eta$. Thus, in order to stabilize the laser performance, a laser output is converted into current for monitoring the performance. The amplitude of the driver output for driving the laser device is controlled so that the average of the monitor current is kept constant.

Japanese Laid-Open Patent Application No. 3-278586 discloses an optical amplitude modulation apparatus having a mechanism for controlling the driver output amplitude to a fixed level. This apparatus is referred to as first conventional apparatus. As is shown in FIG. 1, the first conventional apparatus is made up of a laser diode (LD) 101, a photodiode (PD) 102, a low-pass filter 103, a low-frequency amplifier 104, a phase detector 105, a controller 106, a dc power supply 107, a combiner 108, and a low-frequency oscillator 109.

The combiner 108 superimposes a low-frequency signal from the low-frequency oscillator 109 on a high-frequency modulating signal or current. The laser diode 101 is driven by the modulating signal on which the low-frequency signal is superimposed. The photodiode 102 converts an output light from the laser diode 101 into an electrical signal. The low-pass filter 103 extracts a low-frequency component from the output signal of the photodiode 102. The low-frequency amplifier 104 amplifies the low-frequency signal. The phase detector 105 compares the phase of the amplified low-frequency component with the low-frequency signal from the low-frequency oscillator 109, and detects the slope of the laser output characteristic. The phase detector 105 generates a calibration signal for correcting the detected slope to a predetermined value, and outputs the calibration signal to the controller 106. The controller 106 controls the dc power supply 107 on the basis of the calibration signal. The combiner 108 changes the amplitude of the excitation current applied to the laser diode 101 on the basis of the dc voltage from the power supply 107. In this manner, the output amplitude of the laser diode 101 can be stabilized.

There is another optical modulation apparatus proposed by Japanese Laid-Open Patent Application No. 8-254672. This apparatus is illustrated in FIG. 2. The apparatus is made up of a laser diode (LD) 201, an optical modulator 202, a photocoupler 203, a light-receiving element 204, a band-pass filter (BPF) 205, a variable gain amplifier 206, a phase detector 207, a low-frequency oscillator 208, a dc amplifier 209, and a driver amplifier 210.

The optical modulator 202 modulates the intensity of the output light emitted from the laser diode 201 by a modulating signal on which a sine-wave signal from the low-frequency oscillator 208 is superimposed by the driver amplifier 210. The photocoupler 203 splits the modulated laser beam from the optical modulator 202. A split laser beam is applied to the light-receiving element 204, which converts it into an electrical signal. The band-pass filter 205 extracts a frequency component of the sine-wave signal from the electrical signal supplied thereto. The frequency component thus extracted is applied to the phase detector 207 via the variable gain amplifier 206. The phase detector 207 generates a bias current, which is controlled so as to stabilize the operating point on the basis of the phase difference between the frequency component from the variable gain amplifier 206 and the sine-wave signal from the low-frequency oscillator 208. The bias voltage is applied to the optical modulator 202 via the dc amplifier 209. In this manner, the intensity of the laser output is modulated by the optical modulator 202, so that the operating point of the laser output can be stabilized.

As described above, the conventional apparatuses described in the above-specified applications superimpose the low-frequency signal (pilot signal) on the optical main signal (high frequency signal of the order of a few GHz) in order to detect change of the quantum efficiency $\eta$, and thus cope with degradation due to temperature change and age deterioration.

However, the apparatuses cope with only variation of the slope of the quantum efficiency $\eta$ caused by temperature change and age deterioration. More particularly, there are two factors that change the laser performance due to temperature change. These two factors are increase of the slope of the quantum efficiency $\eta$ and increase of the threshold current for laser emission. The conventional apparatuses can cope with only increase of the slope of the quantum efficiency $\eta$. However, in actuality, the laser output is more greatly affected by increase of the threshold current for laser emission. The laser performance cannot be totally stabilized unless increase of the threshold current for laser emission due to temperature change and age deterioration is eliminated.

Japanese Laid-Open Patent Application No. 7-226714 discloses an optical transmitter capable of solving the above-mentioned problem. This optical transmitter is depicted in FIG. 3. As shown, the optical transmitter is made up of a laser diode (LD) 301, a photodiode (PD) 302, a current switch circuit 304, a D-type flip-flop (D-FF) 305, a capacitor C1, an amplifier 306, a variable resistor Rv1, an error amplifier circuit 307, a bias current circuit 308, a frequency dividing circuit 309, a waveform equalizing circuit 310, an attenuator 311, a current-voltage conversion amplifier circuit 312, a clip circuit 313, a low-frequency detector circuit 314, a capacitor C2, a variable resistor Rv2, and an error amplifier circuit 315.

The D-type flip-flop 305 latches input data (DATA) supplied from the outside of the optical transmitter in synchronism with a clock (CLOCK). The input data thus latched is applied to the current switch circuit 304. The current switch circuit 304 supplies current Ip to the laser diode 301. The photodiode 302 monitors the optical output level of the laser diode 301. The current-voltage conversion amplifier circuit 312 converts current flowing through the photodiode 302 into a voltage signal. The voltage signal is amplified by the amplifier circuit 306, and is then smoothed by the capacitor C1. The smoothed voltage is applied to the error amplifier circuit 307, which is supplied with a first reference voltage generated by the variable resistor Rv1. The error amplifier circuit 307 applies a signal based on the difference between the smoothed voltage and the first reference signal to the bias current circuit 308.

The frequency dividing circuit 309 divides the frequency of the clock supplied from the outside of the optical transmitter, and supplies the waveform equalizing circuit 310 with a resultant clock having a frequency lower than the external clock. The waveform equalizing circuit 310 converts the output waveform of the frequency dividing circuit 309, which is a rectangular waveform, into a sine wave. The attenuator 311 attenuates the sine wave, and applies the attenuated sine wave to the bias current circuit 308. The bias current circuit 308 generates a bias current for driving the laser diode 301 on the basis of the two inputs, and applies the bias current to the laser diode 301.

The voltage signal output by the current-voltage conversion amplifier circuit 312 is applied to the clip circuit 313, which clips the input voltage. The low-frequency detector circuit 314 extracts a low-frequency component from the output signal of the clip circuit 313. The low-frequency component thus extracted is smoothed by the capacitor C2, and is then applied to the error amplifier circuit 315, which is supplied with a second reference voltage generated by the variable resistor Rv2. The error amplifier circuit 315 compares the smoothed voltage with the second reference voltage, and amplifies the difference therebetween. The amplified difference voltage thus obtained is applied to the current switch circuit 304. In this manner, the current switch circuit 304 supplies the laser diode 301 with the current signal generated based on the signal from the D-type flip-flop 305 and the voltage signal from the error amplifier circuit 315.

As described above, the laser diode 301 in the optical transmitter shown in FIG. 3 is driven by not only the bias current generated based on the average of the optical output and the low-frequency component generated based on the clock, but also the current generated based on the average of the low-frequency component partially extracted from the optical output and the data signal. It is therefore possible to control not only the modulating current as well as the bias current and to cope with the problems resulting from both increase of the slope of the quantum efficiency η and increase of the threshold current for laser emission.

However, the optical transmitter shown in FIG. 3 has a disadvantage in that the circuit for superimposing the low-frequency signal having the fixed amplitude on the modulating current is very complex. This prevents downsizing and cost reduction.

In the case where the amplitude of the pilot signal (low-frequency signal) is fixed, the slope of the quantum efficiency η is inclined due to high temperature or age deterioration, the pilot signal superimposed on the optical signal gradually decreases irrespective of whether the amplitude of the driver output is increased. In case where the pilot signal decreases to a low level as compared to noise included in the optical signal, the feedback control using the monitor signal is no longer performed accurately, and the laser waveform is deformed.

SUMMARY OF THE INVENTION

It is an object of the present invention to provide a laser device that exhibits stable laser performance immune to temperature change and age deterioration.

Another object of the present invention is to provide a driver and method for controlling the laser device.

These objects of the present invention are achieved by a laser device comprising: a laser diode; and a controller that superimposes a low-frequency signal on a modulating signal applied to the laser diode, the low-frequency signal having an amplitude that correlates with an amplitude of the modulating signal.

The above objects of the present invention are also achieved by a controller for driving a laser diode, comprising: a controller that superimposes a low-frequency signal on a modulating signal applied to the laser diode, the low-frequency signal having an amplitude that correlates with an amplitude of the modulating signal.

The above objects of the present invention are also achieved by a controller for controlling a laser diode, comprising: a first circuit that extracts a low-frequency signal having an amplitude that correlates with an amplitude of a modulating signal applied to the laser diode; and a second circuit that indicates a characteristic of the laser diode on the basis of the low-frequency signal extracted by the first circuit.

BRIEF DESCRIPTION OF THE DRAWINGS

Other objects, features and advantage of the present invention will become more apparent from the following detailed description when read in conjunction with the accompanying drawings:

FIGS. 7A, 7B and 7C are respectively graphs of functions of a modulation current control system shown in FIG. 4, wherein FIG. 7A shows a relationship among signals when the laser diode operates with no deviation from the designed operation, FIG. 7B shows a relationship among the signals in a case where the slop η of the quantum efficiency decreases and no correction is made, and FIG. 7C shows a relationship among the signals in a case where the slop η of the quantum efficiency decreases and an appropriate correction is made; and FIGS. 8A, 8B and 8C are respectively graphs of functions of a bias current control system shown in FIG. 4, wherein FIG. 8A shows a relationship among signals when the laser diode operates with no deviation from the designed operation, FIG. 8B shows a relationship among the signals in a case where a threshold current Ith increases and no correction is made, and FIG. 8C shows a relationship among the signals in a case where the threshold current Ith increases and an appropriate correction is made.

DESCRIPTION OF THE PREFERRED EMBODIMENTS

According to the present invention, a low-frequency signal having an amplitude that correlates with the amplitude of the modulating signal for driving the laser with a given ratio is superimposed on the modulating signal. A description will now be given of embodiments of the present invention with reference to the accompanying drawings.

Figure 1:
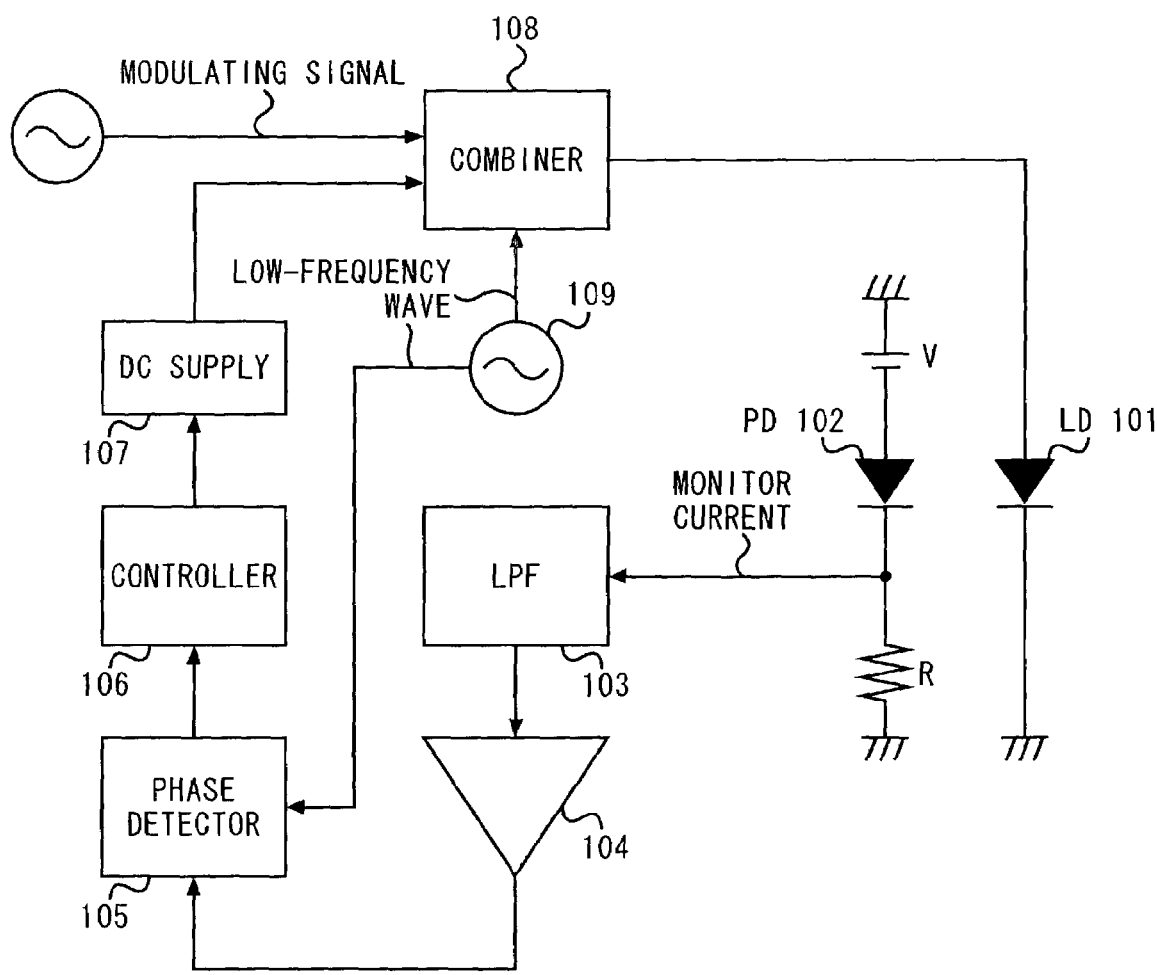
FIG. 1 is a block diagram of a conventional laser device.
Figure 2:
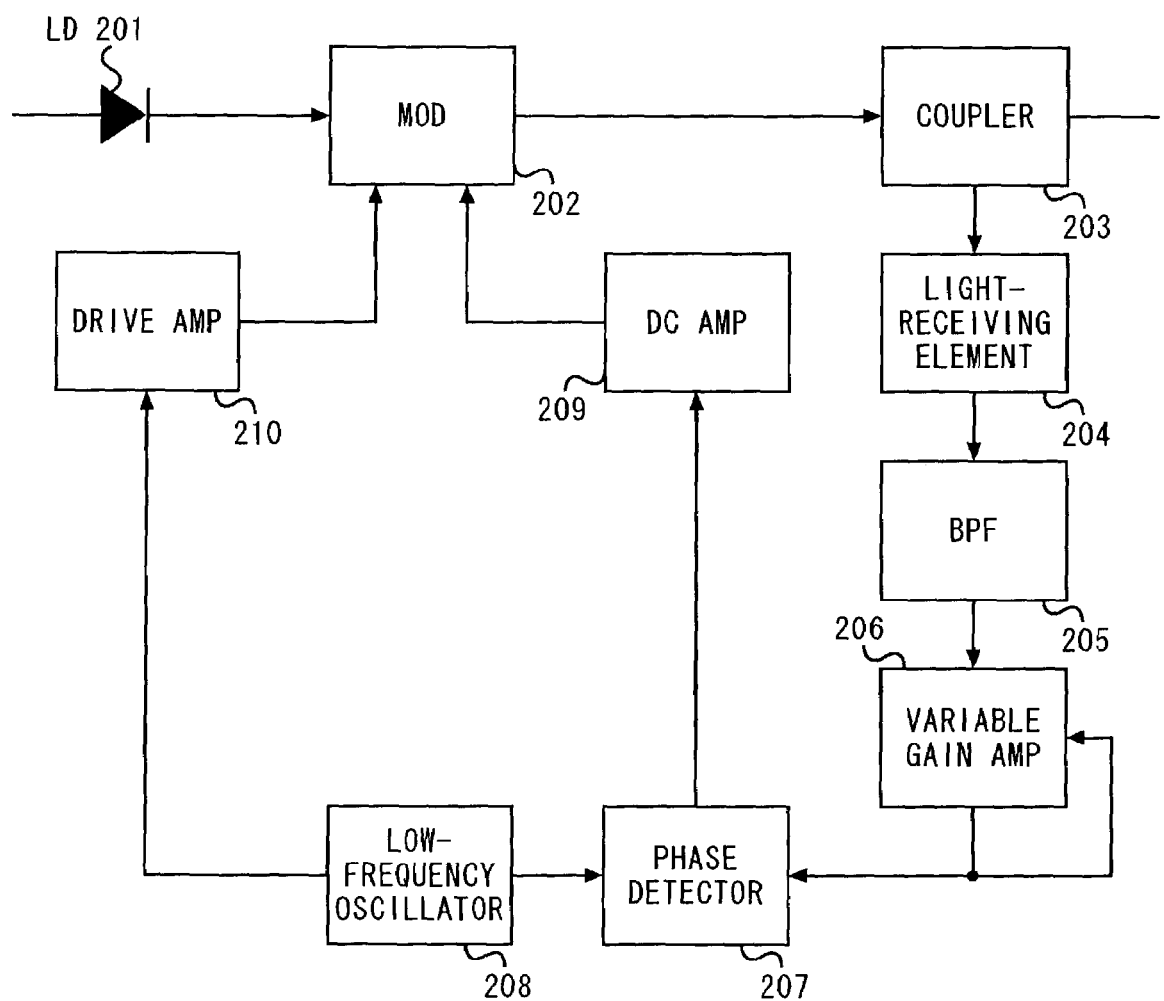
FIG. 2 is a block diagram of another conventional laser device.
Figure 3:
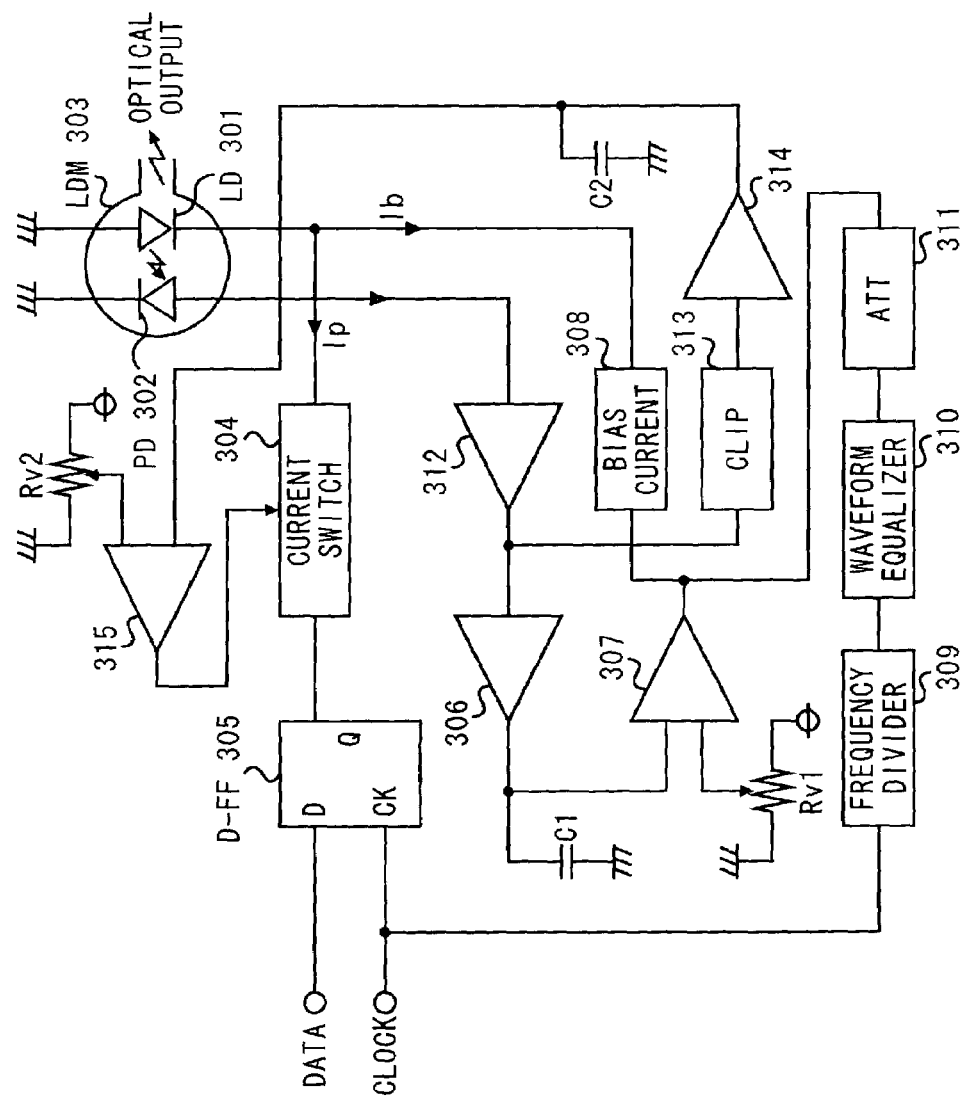
FIG. 3 is a block diagram of yet another conventional laser device.
Figure 4:
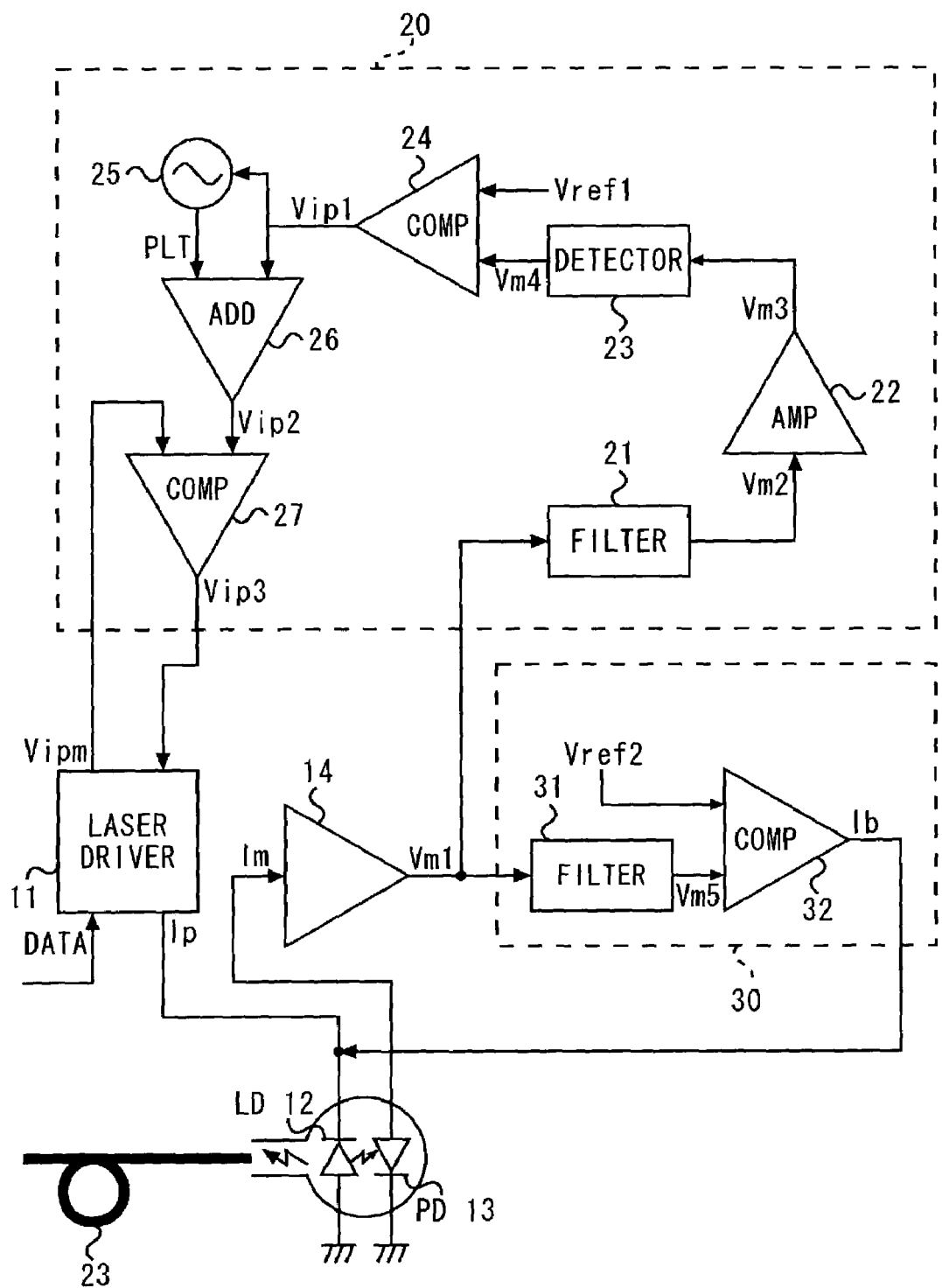
FIG. 4 is a block diagram of a laser device according to an embodiment of the present invention.

FIG. 4 is a block diagram of a laser device 10 according to an embodiment of the present invention. The laser device 10 includes a laser driver 11, a laser diode (LD) 12, a photodiode (PD) 13, a current-voltage converter circuit 14, a modulating current control system 20, and a bias current control system 30.

The laser driver 11 generates a modulating current signal or current Ip based on a data signal DATA (including a clock) supplied from the outside of the laser device 10, and applies it to the laser diode 12. The laser driver 11 monitors the amplitude value of the modulating current Ip, and applies it to the modulating current control system 20 as a monitored amplitude voltage Vipm. The laser driver 11 controls the amplitude of the modulating current Ip on the basis of a control voltage Vip3 supplied from the modulating current control system 20. The laser driver 11 that has the above functions may be preferably provided by an IC chip.

The laser diode 12 is a laser source formed by a semiconductor laser, and oscillates laser on the basis of the modulating current Ip supplied by the laser driver 11 and the bias current Ib supplied by the bias current control system 30. The laser diode 12 employed in the present embodiment is not equipped with any cooling means such as a Peltiert element or fan.

The photodiode 13 is provided on one side of the laser diode 12, and an optical fiber 23 is provided on the opposite side thereof. The photodiode 13 monitors the optical output emitted backward. A monitor current Im, which reflects the monitored optical output, flows in the photodiode 13. The current-voltage converter circuit 14 converts the monitor current Im flowing through the photodiode 13 into a monitor voltage Vm1, which is then applied to the modulating current control system 20 and the bias current control system 30. The photodiode 13 also serves as a low-pass filter that eliminates high-frequency components (modulating signal). That is, the photodiode 13 monitors the low-frequency component of the laser output and the average power. In case where the photodiode 13 is capable of monitoring high-frequency components, a low-pass filter may be provided in the modulating current control system 20. An amplifier that amplifies the voltage signal Vm1 may be provided in the modulating current control system 20.

The modulating current control system 20 generates the control voltage Vip3 for controlling the amplitude of the modulating current Ip output by the laser driver 11 on the basis of the monitor voltage Vm1 from the current-voltage converter circuit 14 and the monitored amplitude voltage Vipm from the laser driver 11. That is, the modulating current control system 20 functions as a controller that feedback-controls the modulating signal Ip output by the laser driver 11. The feedback control employed in the present embodiment copes with change of the slope of the quantum efficiency η in laser performance. The modulating current control system 20 may be formed on a chip.

The bias current control system 30 generates the bias current Ib based on the monitor voltage Vm1, and supplies it to the laser diode 12. That is, the bias current control system 30 functions as a controller that offsets the modulating current Ip applied to the laser diode 12. This controller copes with variation in the threshold current for laser emission.

A description will now be given of the structure and operation of the modulating current control system 20. As is shown in FIG. 4, the modulating current control system 20 includes a filter 21, an amplifier 22, a detector circuit 23, a comparator circuit 24, a low-frequency oscillator 25, an adder circuit 26, and a comparator circuit 27.

The filter 21 eliminates the dc component from the monitor voltage Vm1 from the current-voltage converter circuit 14, and extracts a low-frequency component. The low-frequency component thus extracted is applied to the amplifier circuit 22 as a voltage Vm2, which is amplified thereby. The amplified voltage is applied to the detector circuit 23 as a voltage Vm3.

The detector circuit 23 is a half-wave rectifier circuit. The detector circuit 23 extracts the upper half of the amplitude from the voltage Vm3 received from the amplifier circuit 22, and rectifies it. The resultant voltage Vm4 thus obtained indicates the amplitude value of the voltage Vm3. The circuit starting from the filter 21 and ending with the detector circuit 23 serves as a monitor circuit that monitors the amplitude of the monitor voltage Vm1 applied to the modulating current control system 20. The monitor circuit extracts the low-frequency signal having the amplitude that correlates with the amplitude of the modulating current Ip with a given ratio, and generates a voltage (signal) indicative of the performance of the laser diode 12 from the extracted low-frequency signal. The circuit that monitors the amplitude of the voltage Vm1 is not limited to the above-mentioned structure but may have another circuit configuration having the same function as mentioned above. The circuit made up of the photodiode 13, the current-voltage converter circuit 14, the filter 21, the amplifier circuit 22 and the detector circuit 23 serves as means for monitoring the amplitude of the optical output of the laser diode 12.

The voltage Vm4 thus generated is applied to the comparator circuit 24, which is supplied with a reference voltage Vref1. The comparator circuit 24 compares the voltage Vm4 with the reference voltage Vref1, and generates a control voltage Vip1, which makes the voltage Vm4 equal to the reference voltage Vref1. That is, the comparator circuit 24 compares the voltage obtained by monitoring the laser output or voltage dependent thereon with the reference voltage, and generates the voltage based on the difference therebetween. If the monitor voltage Vm4 is lower than the reference voltage Vref1, the comparator circuit 24 causes the value of the control voltage Vip1 to increase in order to raise the voltage Vm4. In contrast, if the monitor voltage Vm4 is higher than the reference voltage Vref1, the comparator circuit 24 causes the value of the control voltage Vip1 to decrease in order to reduce the voltage Vm4.

The control voltage Vip1 is applied to the low-frequency oscillator 25 and the adder circuit 26. The low-frequency oscillator 25 generates a pilot signal PLT, which is a low-frequency signal having a given frequency and an amplitude based on the control voltage Vip1. That is, the low-frequency oscillator 25 is means for generating the pilot signal PLT, the amplitude of which depends on the input voltage Vip1. By controlling the amplitude of the pilot signal PLT based on the control voltage Vip1, the amplitude of the pilot signal PLT is made to correlate with the value of the control voltage Vip1. This makes a correlation between the value of the control voltage Vip3 and the amplitude of the low-frequency component contained therein, and further makes a correlation between the amplitude of the modulating current Ip controlled by the control voltage Vip3 and the amplitude of the low-frequency signal superimposed on the modulating signal Ip. Preferably, the frequency of the pilot signal PLT is equal to or less than 1% of the frequency of the modulating current Ip, which is the main signal. The pilot signal PLT is applied to the adder circuit 26, which is supplied with the control voltage Vip1.

The adder circuit 26 controls the amplitude of the pilot signal PLT so as to define a given ratio of the amplitude of the pilot signal PLT to the value of the control voltage Vip1, preferably, 10% or less. Such a ratio is, for example, approximately 1%. The amplitude-controlled pilot signal PLT is added to the control voltage Vip1 by the adder circuit 26. That is, the adder circuit 26 adds the pilot signal PLT and the control voltage Vip1 with the given ratio. Since the ratio of the amplitude of the pilot signal PLT to the control voltage Vip1 is fixed, the correlation between the value of the control voltage Vip1 and the amplitude of the pilot signal PLT can be kept constant.

Figure 5:
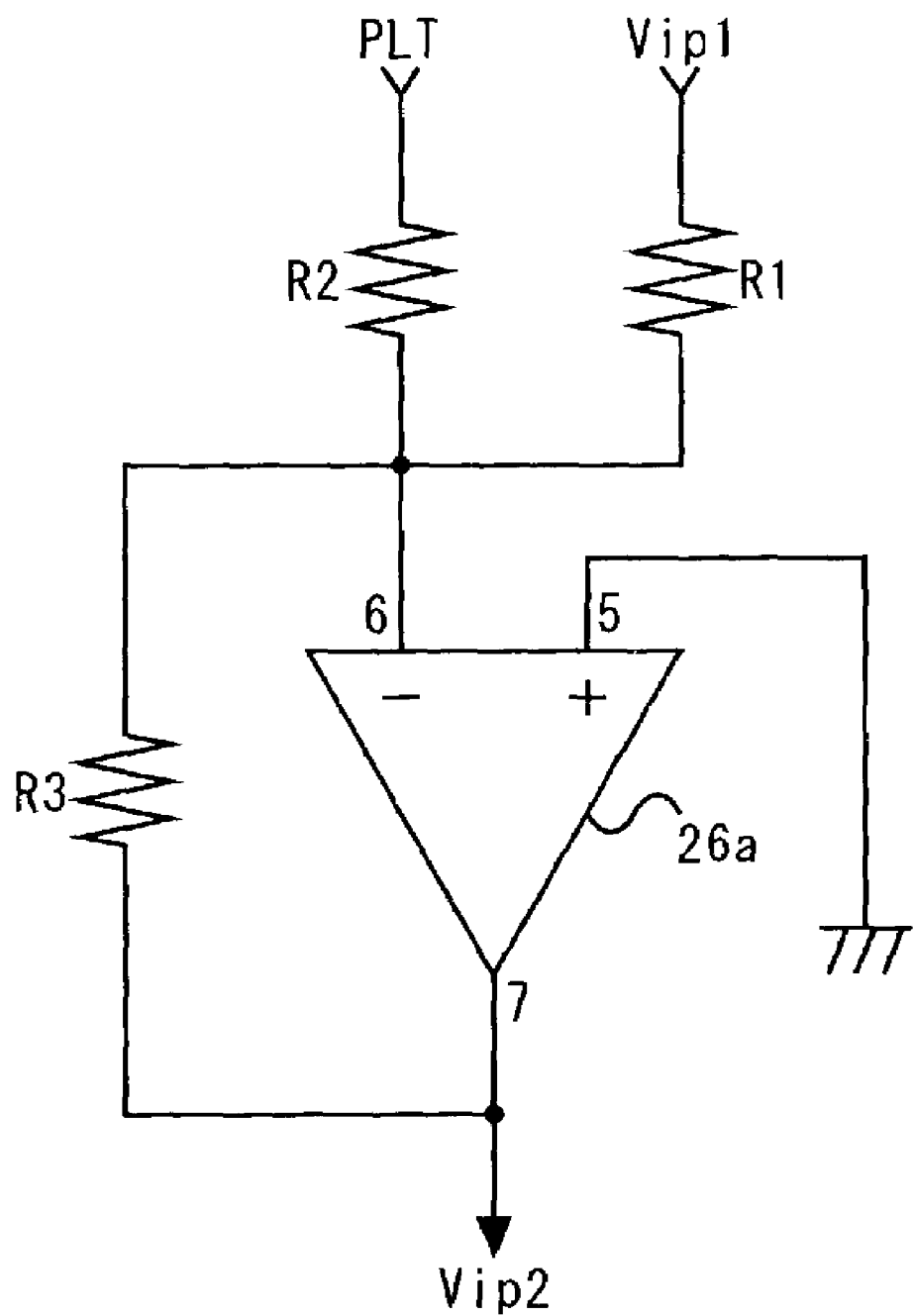
FIG. 5 is a circuit diagram of an adder circuit shown in FIG. 4.

FIG. 5 is a circuit diagram of the adder circuit 26. The adder circuit 26 is an inverting amplifier circuit formed by an operational amplifier 26a. An inverting input terminal 6 of the operational amplifier 26a is supplied, via a resistor R1, with the control voltage Vip1, and is supplied, via a resistor R2, with the pilot signal PLT. A non-inverting terminal 5 of the operational amplifier 26a is grounded. An output terminal 7 is connected to the inverting input terminal 6 via a resistor R3 so as to form a feedback circuit.

When the voltage of the pilot signal PLT applied to one end of the resistor R2 is denoted as Pilot, the value of the control voltage Vip1 is denoted as Vip1, and the resistance values of the resistors R1, R2 and R3 are respectively denoted as R1, R2 and R3, the voltage Vp of the pilot signal PLT available after passing through the operational amplifier 26a can be expressed as equation (1), and the magnitude Vv of the control voltage Vip2 available after passing through the operational amplifier 26a can be expressed as equation (2):

$$Vp = -PLT \times (R2/R3) \quad (1)$$

$$Vv = -Vip1 \times (R1/R3) \quad (2)$$

Thus, the ratio of Vp to Vv is as follows:

$$Vp/Vv = (-PLT \times R2)/(-Vip1 \times R1) \quad (3)$$

$$= \alpha \times PLT/Vip1$$

$$(\alpha = R2/R1)$$

Preferably, the voltage Vp of the pilot signal PLT (low-frequency signal) output by the operational amplifier 26a is equal to or less than 10% of the magnitude Vv of the control voltage Vip2 output by the operational amplifier 26a.

The control voltage Vip2 output by the adder circuit 26 is applied to the comparator circuit 27, which is supplied with the monitored amplitude voltage Vipm that indicates the amplitude of the modulating current Ip output by the laser driver 11. The comparator circuit 27 compares the control voltage Vip2 and the monitored amplitude voltage Vipm, and generates the control voltage Vip3 that makes these voltages equal to each other. The comparator circuit 27 functions as means for controlling the amplitude of the modulating current Ip output by the laser driver 11 on the basis of the voltage with the low-frequency signal (pilot signal) being superimposed thereon. In case where the voltage Vipm obtained by monitoring the modulating current Ip is lower than the control voltage Vip2, the comparator 27 causes the control voltage Vip3 to increase in order to increase the voltage Vipm. In contrast, if the voltage Vipm is larger than the control voltage Vip2, the comparator circuit 27 causes the control voltage Vip3 to decrease in order to decrease the voltage Vipm.

Figure 6:
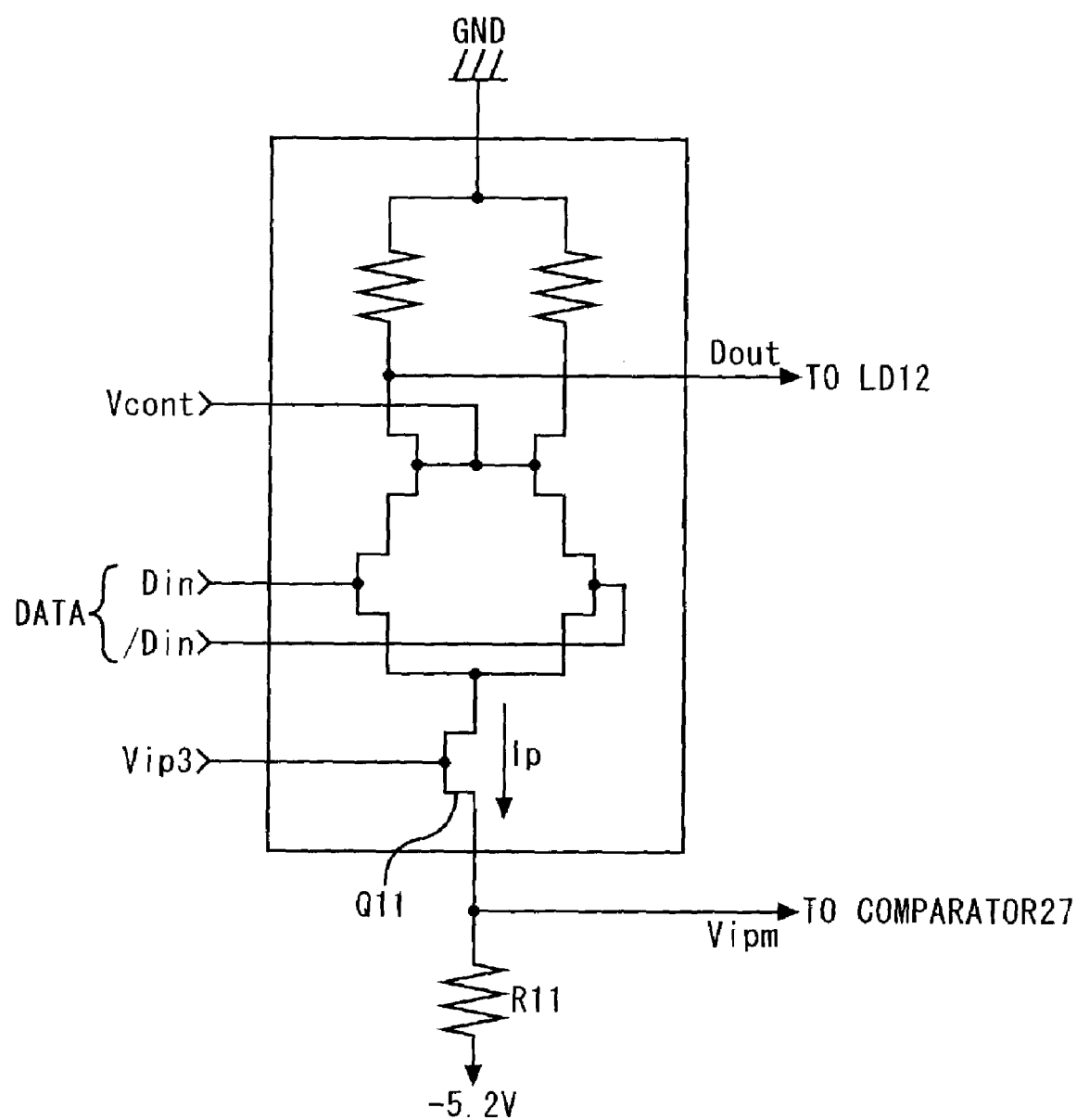
FIG. 6 is a circuit diagram of a laser driver shown in FIG. 4.

FIG. 6 is a circuit diagram of the laser driver 11, which performs feedback control of the amplitude of the modulating current Ip based on the output of the comparator circuit 27. The laser driver 11 has a differential amplifier to which a transistor Q11 is connected. The transistor Q11 controls the modulating current Ip that flows through the differential amplifier. The amplitude of the modulating current Ip is controlled by the control voltage Vip3 applied to the control terminal of the transistor Q11. When the transistor Q11 is a field effect transistor, the control terminal is the gate thereof. When the transistor Q11 is a bipolar transistor, the control terminal is the base thereof. Hereinafter, it is assumed that the transistor Q11 is of bipolar type. A resistor R11 is connected to the collector (or emitter) of the transistor Q11. The resistor R11 functions to convert the modulating current Ip that flows through the transistor Q11 into a voltage. The resistor R11 has a resistance value of, for example, 1Ω. The voltage thus obtained is the monitored amplitude voltage Vimp, which is applied to the comparator circuit 27.

Figure 7A:
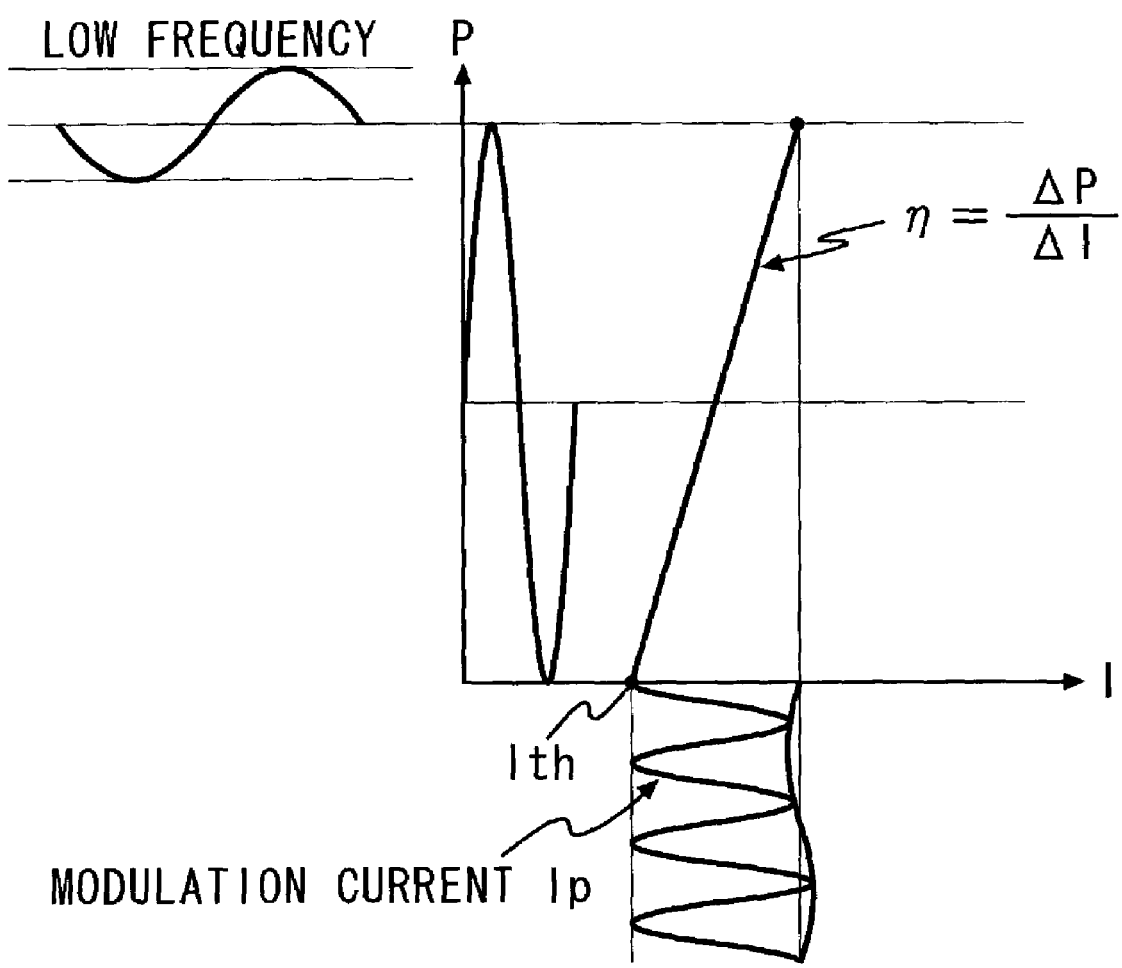
Figure 7B:
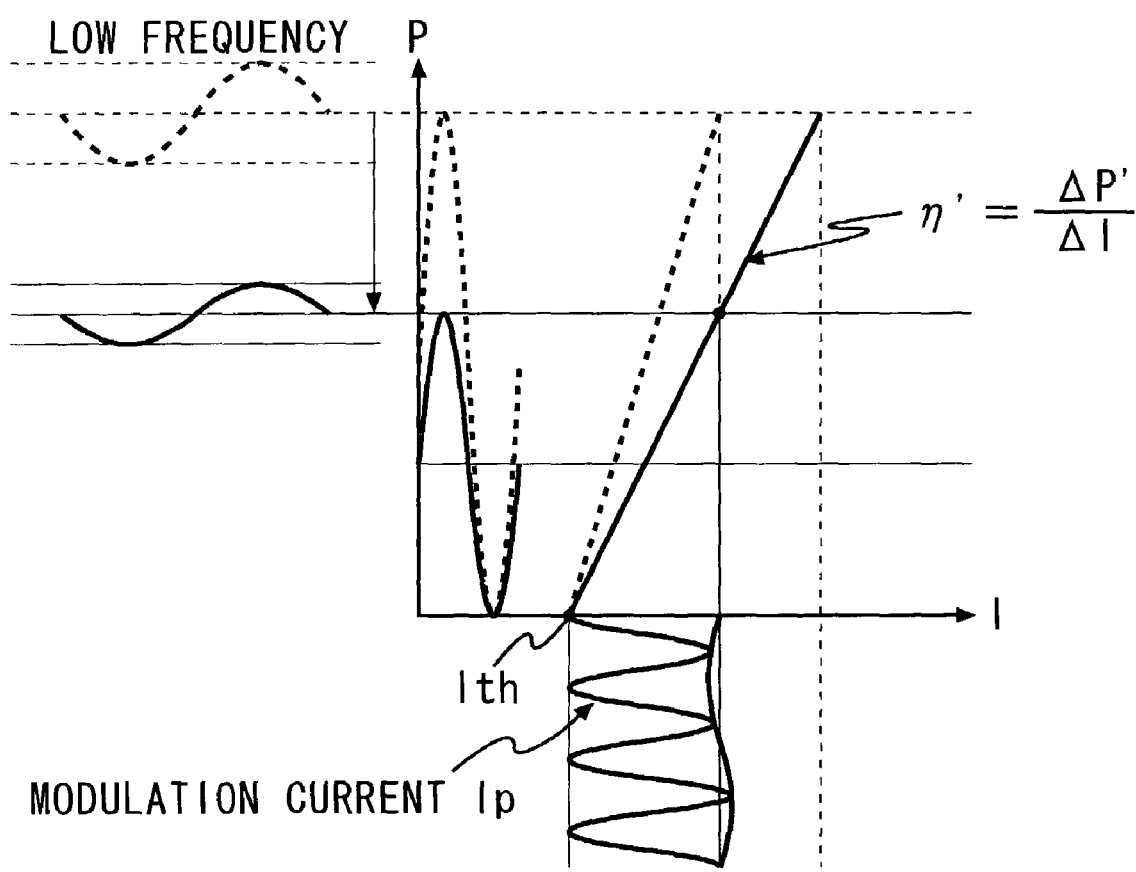
Figure 7C:
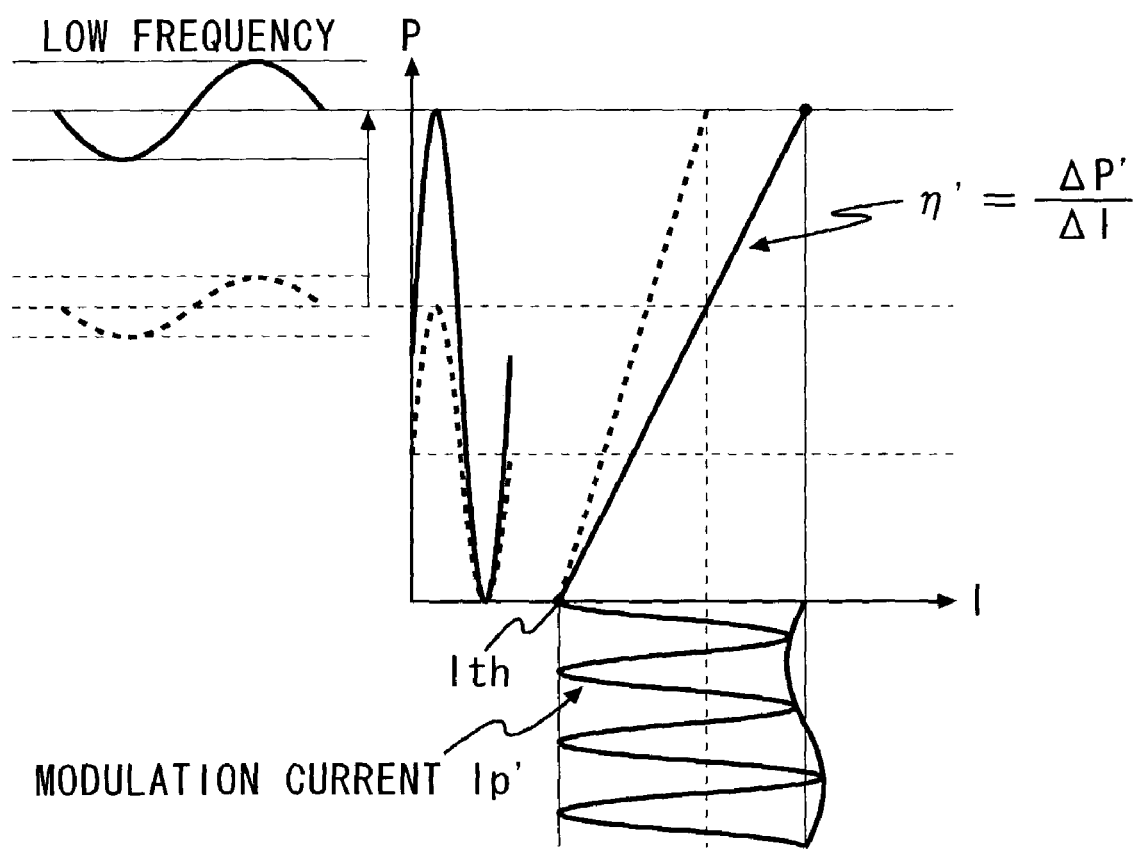

FIGS. 7A through 7C show the function of the modulating current control system 20. More particularly, FIG. 7A is a graph that shows the relationship between the optical output intensity P and the modulating current Ip in a case where the slope of the quantum efficiency η coincides with the designed slope. The horizontal axis denotes the current that flows in the laser diode 12, and the vertical axis denotes the optical output intensity P.

FIG. 7B shows a case where the slope of the quantum efficiency η has been changed due to temperature change or age deterioration. As shown in FIG. 7B, if the slope of the quantum efficiency η decreases (η→η'), the modulating current Ip does not change, nevertheless the laser intensity of the laser diode 12 decreases. Thus, the monitor current Im that flows through the photodiode 13 decreases. Accordingly, the amplitude of the low-frequency signal (pilot signal) contained in the laser beam decreases.

The present embodiment of the invention is capable of solving these problems. As shown in FIG. 7C, the amplitude of the modulating current Ip is increased by a magnitude that corresponds to the difference between the original slope of η and the decreased slope of η'. Additionally, the amplitude of the low-frequency signal superimposed on the modulating current Ip is also increased with the ratio equal to the above-mentioned ratio with which the modulating current Ip is increased. It is therefore possible to cope with change of the slope of the quantum efficiency η and maintain the optical intensity at the fixed level. In this manner, the laser device 10 operates stably.

A description will now be given of the structure and operation of the bias current control system 30, which includes a filter 31 and a comparator circuit 32, as shown in FIG. 4.

The filter 31 eliminates the low-frequency component from the monitor voltage Vm1 from the current-voltage converter circuit 14, and extracts the average power, which is the DC component. The average power thus extracted is applied to the comparator circuit 32 as a voltage Vm5.

The comparator 32 is supplied with the voltage Vm5 and a reference voltage Vref2, and compares these voltages. The filter 31 and the comparator 32 function to monitor the average of the voltage applied to the bias current control system 30. A circuit composed of the filter 31, the comparator circuit 32, the photodiode, and the current-voltage converter circuit 14 functions as means for monitoring the average power of the laser output.

The comparator circuit 32 controls the magnitude of the bias current Ib so that the voltage Vm5 becomes equal to the reference voltage Vref2. The comparator circuit 32 has a voltage-current converter circuit at the final stage. This circuit converts the voltage obtained by the above-mentioned comparing operation into the bias current Ib. In short, the comparator circuit 32 compares the average power of the laser output with the reference voltage Vref2, and generates the bias current Ib based on the difference therebetween.

If the voltage corresponding to the average power of the laser output obtained by monitoring the backlight is less than the reference voltage Vref2, the comparator circuit 32 causes to the bias current Ib to increase in order to increase the average power. In contrast, if the voltage corresponding to the average power of the laser output is greater than the reference voltage Vref2, the comparator circuit 32 causes the bias current Ib to decrease in order to reduce the average power.

Figure 8A:
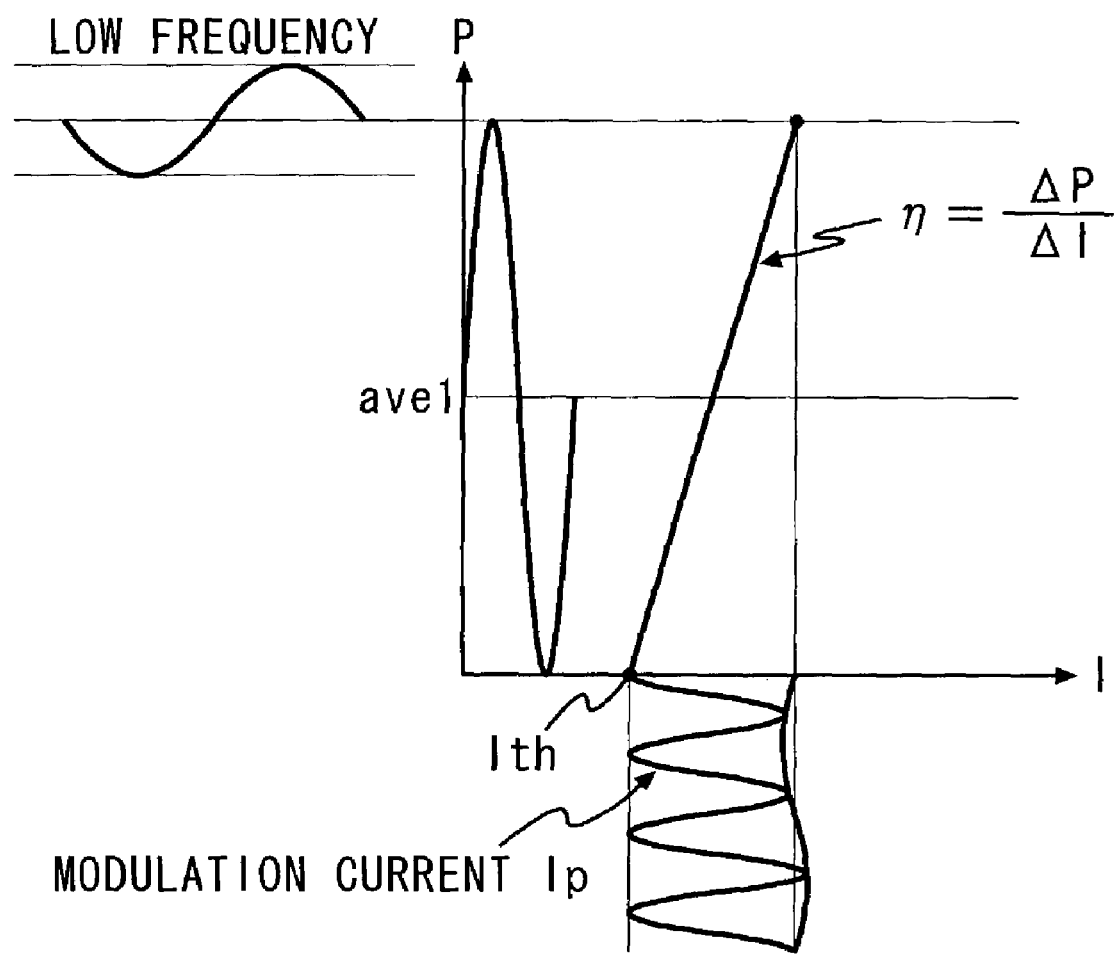
Figure 8B:
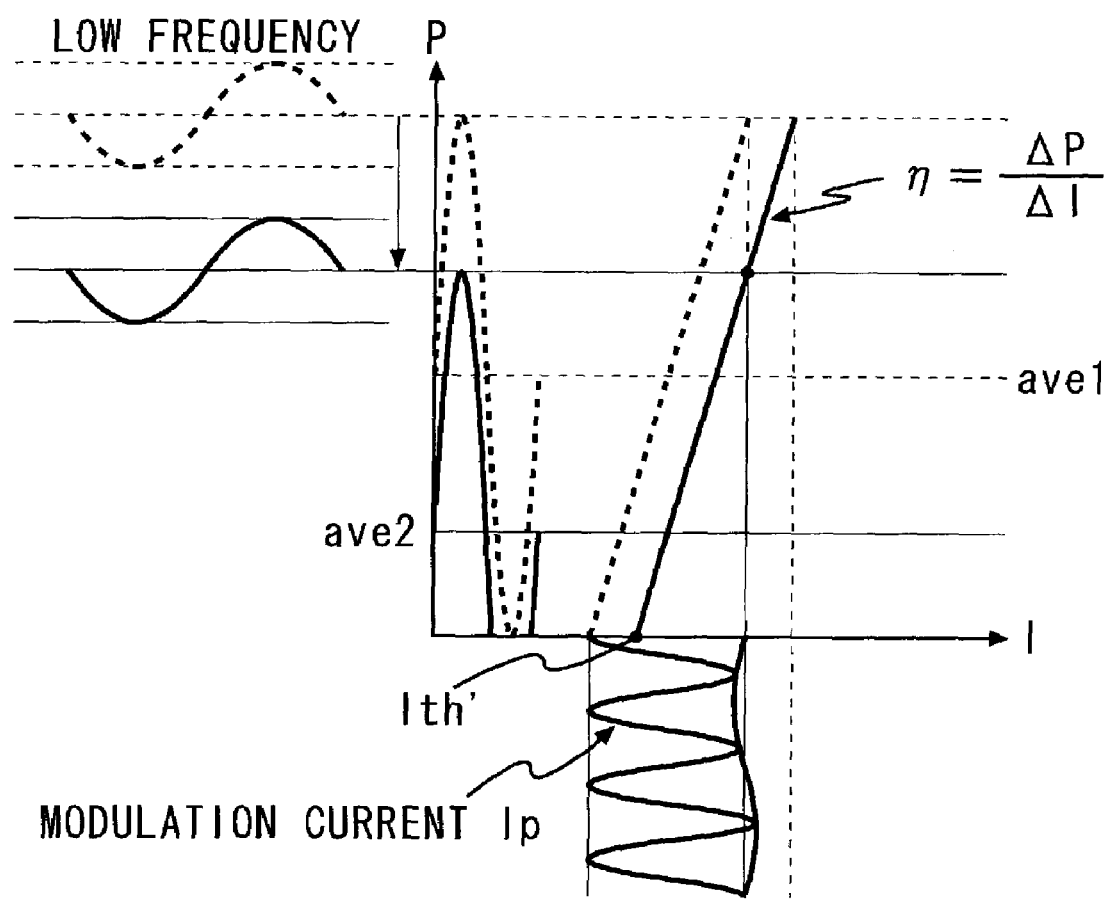
Figure 8C:
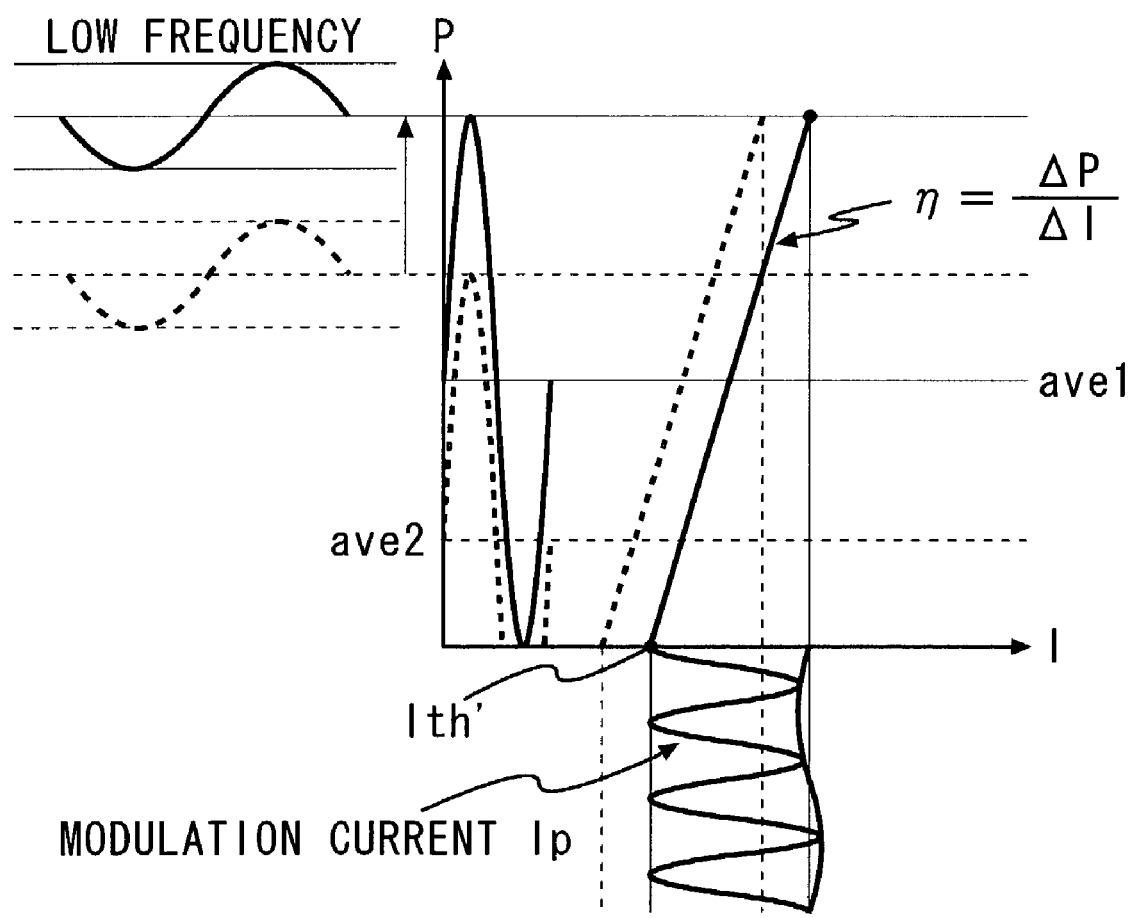

The function of the bias current control system 30 is illustrated in FIGS. 8A through 8C.

FIG. 8A is a graph that shows the relationship between the optical output intensity P and the modulating current Ip in a case where the threshold current Ith coincides with the designed threshold current Ith. The horizontal axis denotes the current that flows in the laser diode 12, and the vertical axis denotes the optical output intensity P.

FIG. 8B shows a case where the threshold current Ith has been changed due to temperature change or age deterioration. As shown in FIG. 8B, if the threshold current Ith increases (Ith→Ith'), an offset is added to the current necessary for operating the laser diode 12. Thus, even if there is no change of the amplitude of the modulating current Ip, the I-P curve having the slope of the quantum efficiency η shifts rightward, and the optical power of the laser beam decreases. Although there is no change in the amplitude of the low-frequency signal superimposed to the output laser, the average intensity of the laser output signal decreases.

The present embodiment of the invention is capable of solving these problems. As shown in FIG. 8C, an offset is added to the modulating current Ip that flows through the laser diode 12. This offset is provided by controlling the bias current Ib. Thus, the movement of the I-P curve having the slope η can be compensated for, so that the laser power can be maintained at the designed level. This realizes stable operation of the laser device 10.

As described above, the amplitude of the low-frequency signal (pilot signal) correlates with the amplitude of the modulating signal (current). Thus, in case where the slope of the quantum efficiency η changes, or the amplitude of the modulating current is required to be changed due to another factor, the low-frequency signal can be continuously controlled appropriately as shown in FIGS. 7A through 7C or FIGS. 8A through 8C.

The laser device, controller and driver for controlling the laser device according to the present invention is capable of stably controlling the operating point with the simple structure. According to the present invention, change of the laser characteristics can be corrected with the low-frequency signal that has the amplitude correlating with the amplitude of the modulating signal. It is therefore possible to discriminate change of the laser characteristic due to change of the slope of the quantum efficiency η and change thereof due to another factor and to cope with such change appropriately. Thus, the laser device can operate stably.

The method for controlling the laser driver generates the control signal to be applied to the laser device by using the low-frequency signal that has the amplitude correlating with the amplitude of the modulating signal. Thus, change of the laser characteristics can be corrected appropriately.

The present invention is not limited to the specifically disclosed embodiments, and other embodiments, variations and modification may be made without departing from the scope of the present invention.

The present invention is based on Japanese Patent Application No. 2002-182090 filed on Jun. 21, 2002, the entire disclosure of which is hereby incorporated by reference.

What is claimed is:

1. A laser device comprising:
a laser diode; and
a controller that superimposes a low-frequency signal on a modulating signal applied to the laser diode, the low-frequency signal having an amplitude that correlates with an amplitude of the modulating signal
wherein the controller comprises:
an amplitude monitor part that monitors the amplitude of the low-frequency signal contained in laser light emitted by the laser diode and generates a first voltage based on a monitored amplitude of the low-frequency signal;
a voltage output part that generates a second voltage that corresponds to a difference between the first voltage and a first reference voltage;
a pilot signal output part that generates a pilot signal having a low frequency and an amplitude based on the second voltage;
an adder part that adds the pilot signal and the second voltage with a given ratio; and
a modulating signal output part that controls the amplitude of the modulating signal on the basis of the second voltage with the pilot signal being added thereto and thus supplies the laser diode with the modulating signal with the low-frequency signal being superimposed thereon.

2. The laser device as claimed in claim 1, wherein the amplitude of the low-frequency signal is equal to or less than 10% of the amplitude of the modulating signal.

3. The laser device as claimed in claim 1, wherein the controller has a feedback circuit that feedback-controls the amplitude of the modulating signal based on the amplitude of the low-frequency signal, an optical intensity of laser light being controlled at a fixed level.

4. The laser device as claimed in claim 1, wherein the adder part comprises:
an operational amplifier having a first input terminal with a given voltage being applied thereto;
first and second resistors connected to a second input terminal of the operational amplifier in parallel; and
a third resistor connected between an output terminal of the operational amplifier and the second input terminal, the pilot signal and the second voltage being applied to the second input terminal via the first and second resistors, the given ratio depending on a ratio of resistance values of the first and second resistors.

5. The laser device as claimed in claim 1, wherein the amplitude monitor part comprises:
a first part that converts the laser light into an electrical signal;
a second part that converts the electrical signal into a voltage signal; and
a third part that rectifies the voltage signal from the second part, a rectified voltage signal being the first voltage.

6. A controller for driving a laser diode, comprising:
a controller that superimposes a low-frequency signal on a modulating signal applied to the laser diode, the low-frequency signal having an amplitude that correlates with an amplitude of the modulating signal
wherein the controller comprises:
an amplitude monitor part that monitors the amplitude of the low-frequency signal contained in laser light emitted by the laser diode and generates a first voltage based on a monitored amplitude of the low-frequency signal;

a voltage output part that generates a second voltage that corresponds to a difference between the first voltage and a first reference voltage;

a pilot signal output part that generates a pilot signal having a low frequency and an amplitude based on the second voltage;

an adder part that adds the pilot signal and the second voltage with a given ratio; and a modulating signal output part that controls the amplitude of the modulating signal on the basis of the second voltage with the pilot signal being added thereto and thus supplies the laser diode with the modulating signal with the low-frequency signal being superimposed thereon.

7. The controller as claimed in claim 6, wherein the adder part comprises:

an operational amplifier having a first input terminal with a given voltage being applied thereto;

first and second resistors connected to a second input terminal of the operational amplifier in parallel; and a third resistor connected between an output terminal of the operational amplifier and the second input terminal, the pilot signal and the second voltage being applied to the second input terminal via the first and second resistors, the given ratio depending on a ratio of resistance values of the first and second resistors.

8. The controller as claimed in claim 6, wherein the amplitude monitor part comprises:

a first part that converts the laser light into an electrical signal;

a second part that converts the electrical signal into a voltage signal; and a third part that rectifies the voltage signal from the second part, a rectified voltage signal being the first voltage.

* * * * *